United States Patent
Srinivasa Raghavan et al.

(10) Patent No.: US 7,545,694 B2
(45) Date of Patent: Jun. 9, 2009

(54) SENSE AMPLIFIER WITH LEAKAGE TESTING AND READ DEBUG CAPABILITY

(75) Inventors: Vijay Kumar Srinivasa Raghavan, Colorado Springs, CO (US); Ryan Tasuo Hirose, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/839,632

(22) Filed: Aug. 16, 2007

(65) Prior Publication Data

US 2008/0042691 A1 Feb. 21, 2008

Related U.S. Application Data

(60) Provisional application No. 60/838,485, filed on Aug. 16, 2006.

(51) Int. Cl.
*G11C 7/06* (2006.01)

(52) U.S. Cl. .................. 365/207; 365/189.15

(58) Field of Classification Search ............. 365/207, 365/189.15
See application file for complete search history.

(56) References Cited

U.S. PATENT DOCUMENTS

| 5,889,708 | A * | 3/1999 | Hwang | 365/189.07 |
| 2002/0003734 | A1* | 1/2002 | Kim et al. | 365/201 |
| 2005/0073339 | A1* | 4/2005 | Rho | 327/50 |

* cited by examiner

*Primary Examiner*—Huan Hoang
*Assistant Examiner*—Jay Radke

(57) ABSTRACT

Disclosed is a high speed and power efficient dual mode sense amplifier circuit, which comprises a configuration selector further comprising a read amplifier, a debug circuit and a backup read circuit. The dual mode sense amplifier circuit also comprises a controllable input node further comprising an enabling circuit, the controllable input node being coupled to the configuration selector and the dual mode sense amplifier circuit comprises a differential signal generator further comprising a reference signal source, the differential signal generator is coupled to the controllable input node. A method of dual mode sensing and other embodiments are also disclosed.

14 Claims, 5 Drawing Sheets

SENSE AMPLIFIER WITH LEAKAGE TESTING AND READ DEBUG CAPABILITY

CROSS-REFERENCE TO RELATED APPLICATIONS

The present application claims the benefit of priority under 35 U.S.C. 119(e) to U.S. Provisional Patent Application Ser. No. 60/838,485 filed on Aug. 16, 2006, entitled A High Speed and Power Efficient Sense Amplifier with Leakage Testing and Read Debug Capability; which application is hereby incorporated by reference.

TECHNICAL FIELD

The present invention relates to sense amplifier circuits generally and particularly to a high speed and power efficient sense amplifier with leakage testing and read debug capability for use in an integrated circuit.

BACKGROUND

Conventional high speed memory circuits require sensing circuits (also referred to as sense amplifier circuit) to sense and amplify a small signal, which is supplied by a memory cell when selected for a read operation. The sensing circuits are designed so that the small signal is detected reliably during logic 0 or logic 1 read operation.

A conventional sense amplifier circuit can detect a differential voltage between two nodes close to a source voltage (Vpwr). The nodes pertain to bit lines (BL and BLB) of a memory circuit. The sense amplifier circuit outputs a logic 0 or logic 1 value, thereby indicating data inside a memory cell. Typically, latch based sense amplifiers are used to achieve high speed and low power while operating the memory cell.

Referring to FIG. 1, a conventional linear sense amplifier 100 is shown, which comprises a plurality of NMOS (N-channel Metal Oxide Semiconductor) input transistors 110, a plurality of PMOS (P-channel Metal Oxide Semiconductor) transistors 120 coupled to each other in a current mirror configuration and coupled to the plurality of NMOS input transistors 110, a sense enabling (enabling signal saen) NMOS transistor 130 coupled to the common node of the plurality of NMOS input transistors 110. An output terminal (dataout) of the sense amplifier 100 generates a logic 1 or logic 0 output signal. The plurality of NMOS input transistors 110 is fed with a differential signal (inp and inm). The linear sense amplifier 100 is powered by a higher voltage supply Vcc and is coupled to a grounded node Vss.

A disadvantage of the conventional linear sense amplifier is that it draws more current and is slower in terms of access time compared to a conventional latch amplifier (explained in the next paragraph) for a given supply current specification.

Referring to FIG. 2, a conventional latch based sense amplifier 200 is shown, which comprises a plurality of NMOS input transistors 210, a plurality of cross coupled PMOS transistors 220 (in a positive feedback arrangement) coupled to the plurality of NMOS input transistors 210 and a sense enabling NMOS transistor 230 coupled to a common node of the plurality of NMOS input transistors 210. An output terminal (dataout) of the sense amplifier 200 generates a logic 1 or logic 0 output signal. The plurality of NMOS input transistors 210 is fed with a differential signal (inp and inm). The linear sense amplifier 200 is powered by a higher voltage supply Vcc and is coupled to a grounded node Vss.

A disadvantage of the conventional latch based sense amplifier is that it is not suitable for measuring very low leakage current or differential signals because of its sensitivity to input differential (non-overlapping) signals at the time of turn on of the sense amplifier. If the sense timing is incorrect, the latch based sense amplifier fails to read correct data due to incorrect polarity at its input while turn-on of a memory cell. The sense differential generated solely by the leakage currents in the memory array is very small and it takes a long time to generate a reasonable differential. This means that the latch based sense amplifiers may read incorrect data if they are turned on without the correct differential at its inputs.

It is therefore desirable that a power efficient and high speed sense amplifier with memory leakage testing and read debug capability be provided.

DETAILED DESCRIPTION

Embodiments of the present invention are discussed below in conjunction with the figures. The embodiments set forth a circuit and a method for high speed and power efficient dual mode sense amplifier, which measures memory cell leakages and is capable of debugging memory read operations.

Figure 1:
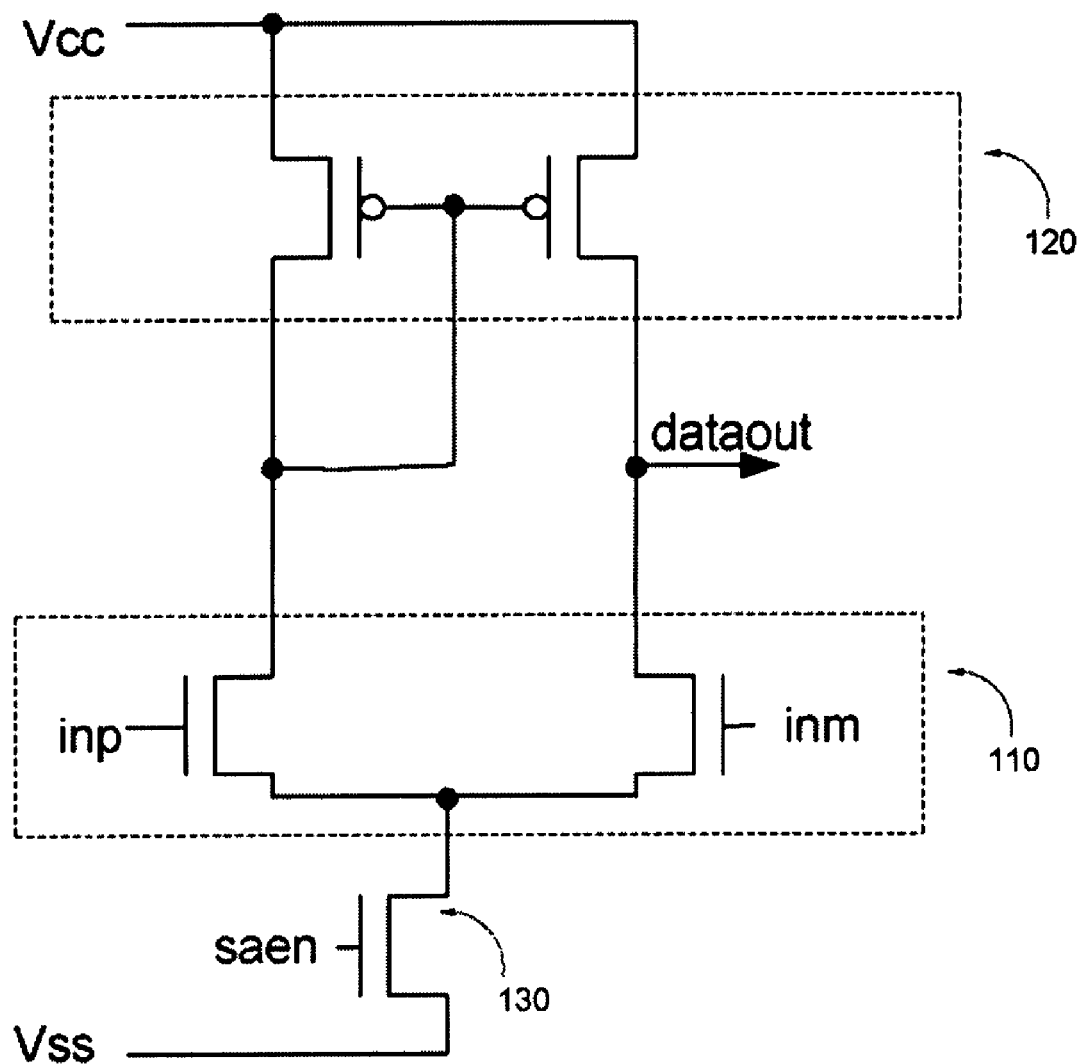
FIG. 1 (Prior art) illustrates a conventional linear sense amplifier.
Figure 2:
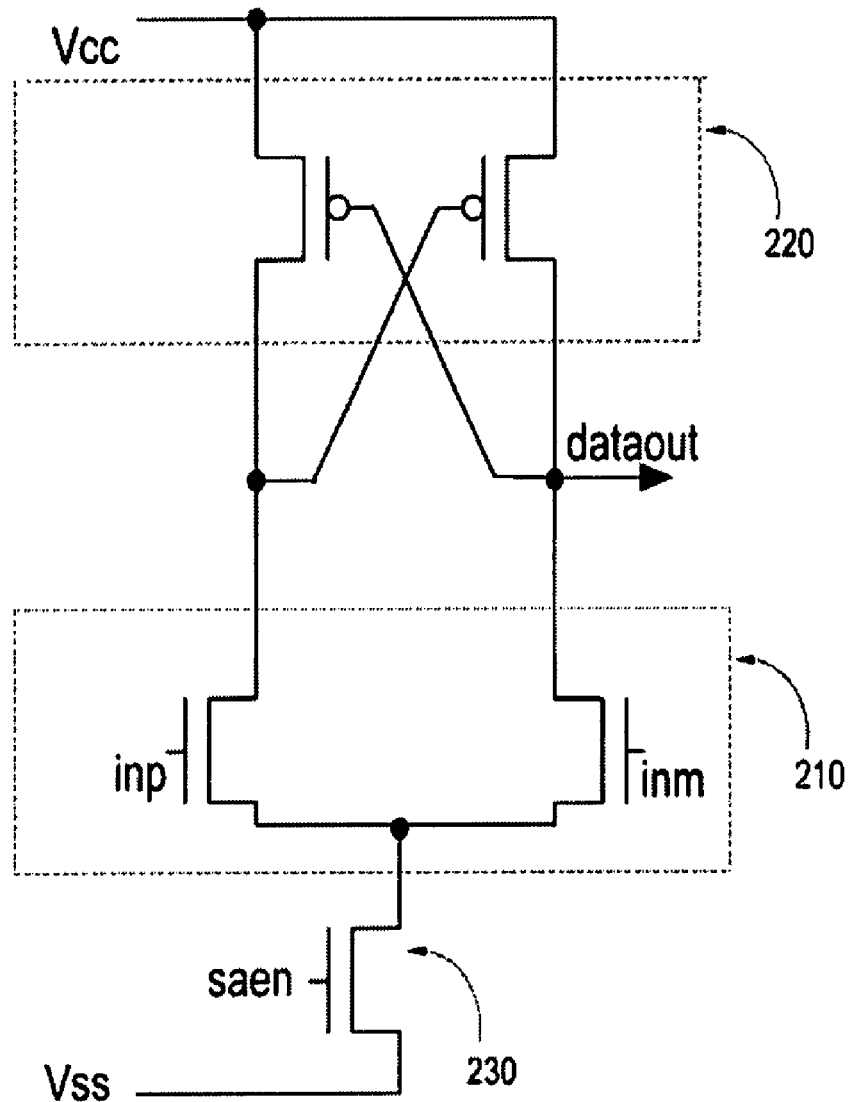
FIG. 2 (Prior art) illustrates a conventional latch based sense amplifier.
Figure 3:
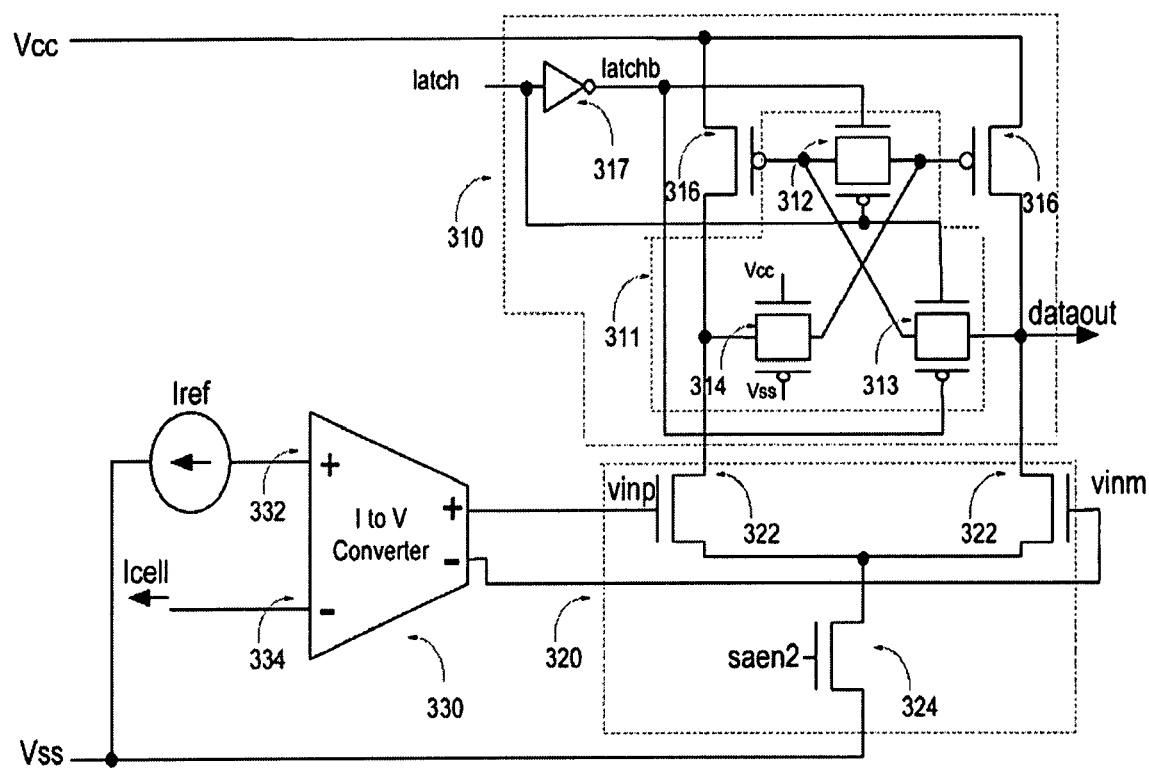
FIG. 3 illustrates an improved dual mode sense amplifier circuit.

Referring to FIG. 3, dual mode sense amplifier circuit 300 is shown, which comprises a configuration selector 310 further comprising a read amplifier, a debug circuit and a backup read circuit. A controllable input node 320 comprising an enabling circuit is coupled to the configuration selector 310. The sense amplifier circuit 300 also comprises a differential signal generator 330 further comprising a reference signal source, wherein the differential signal generator 330 is coupled to the controllable input node. The dual mode sense amplifier 300 is powered by a higher voltage supply Vcc at a first terminal and is coupled to a lower voltage supply (grounded node) Vss at a second terminal. The higher voltage supply Vcc is directly coupled to a terminal of the configuration selector 310 and the grounded node Vss is directly coupled to a terminal of the controllable input node 320.

The configuration selector 310 comprises a plurality of cross coupled transmission gates 311. A plurality of transistors 316 is coupled to the plurality of cross coupled transmission gates 311 and an inverter 317 is selectively coupled to the plurality of cross coupled transmission gates 311 in a latch enable configuration (enables a differential amplifier to operate as a latch differential amplifier) and in a linear enable configuration (enables a differential amplifier to operate as a linear differential amplifier). The plurality of transistors 316 is coupled to the plurality of cross coupled transmission gates in a positive feedback configuration. The plurality of transistors 316 further comprises a plurality of PMOS (P channel Metal Oxide Semiconductor) and a plurality of NMOS (N channel Metal Oxide Semiconductor) transistors. In an embodiment, the plurality of transistors 316 comprises a plurality of PMOS transistors. An external signal (latch) is applied to the inverter 317, which is then inverted (latchb) and is applied to the plurality of cross coupled transmission gates 311.

The plurality of cross coupled transmission gates 311 comprises a first transmission gate 312, a second transmission gate 313 and a third transmission gate 314. Both the first transmission gate 312 and the second transmission gate 313 are coupled at their respective control terminals to an output and an input of the inverter 317. The third transmission gate 314 is coupled to the higher voltage supply Vcc and the lower voltage supply Vss at its control terminals. The first transmission gate 312 is coupled at its input terminal to a gate terminal of the PMOS transistor at an input node (first PMOS transistor) of the plurality of transistors 316. The first transmission gate 312 is coupled at its output terminal to a gate terminal of the PMOS transistor at an output node (second PMOS transistor) of the plurality of transistors 316. The second transmission gate 313 is coupled at its input terminal to a node between the input terminal of the first transmission gate 312 and the gate terminal of the first PMOS transistor of plurality of transistors 316. The second transmission gate 313 is also coupled at its output terminal to the output node of the plurality of transistors 316 (generates dataout). The third transmission gate 314 is coupled at its input terminal to the input node of the plurality of transistors 316. The third transmission gate 314 is also coupled at its output terminal to a node between the output terminal of the transmission gate 312 and the second PMOS transistor of the plurality of transistors 316.

Thus, it can be seen that the plurality of cross coupled transmission gates is selectively coupled to the inverter 317. Signals (Vcc, Vss and output of the inverter 317) applied to the plurality of cross coupled transmission gates 311 cause data read, data debug and data back up read functions to be effectuated. The data read, data debug and data back up read functions will be discussed below with reference to latch mode and linear mode of sense amplifier 300.

The controllable input node 320 comprises a plurality of input transistors 322 coupled to a plurality of differential input signals from the differential signal generator 330. The input node 320 also comprises an enabling transistor 324 coupled to a latch sense enable signal (saen2) at its control terminal (gate terminal), wherein vinp and vinm are two differential input signals applied at input terminals of the plurality of input transistors 322. The enabling transistor 324 is coupled to a common input node of the plurality of input transistors 322. The plurality of input transistors 322 comprises a plurality of NMOS (N-channel Metal Oxide Semiconductor) transistors 322. The enabling transistor 324 is a NMOS transistor.

The differential signal generator 330 comprises a current to voltage converter 330 (I to V converter), which further comprises a differential amplifier. The differential amplifier comprises a plurality of input terminals (a current reference Iref and a memory cell current Icell) and a plurality of output voltage terminals. The differential amplifier is a dual input dual output differential amplifier. A current reference Iref is coupled to a positive input terminal 332 (+) of the differential amplifier and a current signal Icell is coupled to a negative input terminal 334 (−) of the differential amplifier.

In a first mode, the sense amplifier 300 works as a half latch differential amplifier. In an embodiment, the half latch amplifier implies that only p channel transistors (PMOS transistors) of the sense amplifier are cross coupled through the plurality of transmission gates 311. In the first mode (may also be referred to as latch mode), when input node (latch) is applied with a logic high/logic 1 signal, the first transmission gate 312 is turned off and both the second transmission gate 313 and the third transmission gate 314 are turned on. Enabling the latch mode causes the establishment of a cross coupled positive feedback configuration in the sense amplifier 300 through the plurality of transmission gates 311. Thus, at turn on of the sense amplifier 300, if it sees a given polarity differential, it amplifies the polarity differential to Vcc (higher voltage supply) and to Vss (grounded node) rail. This effect cannot be reversed due to latching positive feedback action. In a second mode (may also be referred to as linear mode), the sense amplifier 300 works as a linear differential amplifier when the input node (latch) is applied with a logic low/logic 0 signal. The first transmission gate 312 and the third transmission gate 314 are turned on and the second transmission gate 313 is turned off. The third transmission gate 314 remains turned on in both linear and half latch modes of operation.

Both the latch mode and the linear mode are described below in detail. The sense amplifier 300 is capable of a fast and low power read of the memory cell data. In a normal memory read mode, the sense amplifier 300 is configured as a latch sense amplifier. The sense amplifier 300 operates in the following manner. In a first step, the current to voltage converter 330 compares a current reference (Iref) with a memory cell current (Icell) and outputs a differential voltage based on a differential input current (the difference between Iref and Icell). In a second step, when sufficient voltage differential has developed at the inputs vinp and vinm of the sense amplifier 300, the enabling transistor 324 is turned on, which starts the latching mechanism. In a third step, the voltage differential at the inputs of the sense amplifier 300 quickly gets amplified due to the latch action and the output data appears at a node dataout. By virtue of the latch action, the memory cell read access is fast with low power consumption. The output data in latch sensing will be incorrect if the polarity of input differential (difference between vinp and vinm) to the sense amplifier 300 is incorrect at the instant of enabling transistor 324 turn on. The sense amplifier 300 output is irreversible due to positive feedback regenerative action of the latch sense amplifier. Hence, the linear mode of the amplifier is used in case the timing of enabling transistor 324 is incorrect for memory read operation, debug and/or for backup read operation purposes. Unlike the latch mode, in the linear mode the cross coupled positive feedback configuration of devices does not exist. In the linear mode, even if the input differential at the sense amplifier 300 input is incorrect at the time of the enabling transistor 324 turn on, the sense amplifier has the capability to revert to the correct data output when the input differential signals do become correct. Thus, the debug capability in linear mode of operation helps in speeding up the debug process of memory read operation and allows for faster sampling of the part to the market.

In the linear mode the memory cell leakage can also be measured. In one embodiment, the erase current of the memory cell is in the order of a few microamperes (a minimum of 8 microamperes) and program current of the memory cell is in the order of sub microamperes (a maximum of 1 microamperes). The reference current (Iref) to the current amplifier is set between the program current and the erase current (4.5 microamperes in an embodiment). The sense amplifier sees a current differential of 3.5 microamperes for both erase and program reads of the memory cell, which is then amplified and generated as logic 1 or logic 0 output by the sense amplifier 300.

While reading a programmed memory cell, leakage current of deselected erase cells degrades the current differential presented at the inputs of the current to voltage converter 330. The memory cell leakage is therefore characterized (leakage with all cells in the array deselected), which is used to debug and tweak the technology for obtaining improved leakage characteristics. To measure memory cell leakages, the sense amplifier 300 is put in the linear mode of sensing and the current reference (Iref) is set to the leakage specification limit (0.5 uA in an embodiment). In this mode of linear sensing, if the array leakage (Icell) is greater than 0.5 uA, the output data shows up as a logic 0 and if the leakage is lower than 0.5 uA, then the output data shows up as a logic 1. Since the current differentials during leakage testing is very small (in the sub-microampere range), it takes longer for sufficient input differential to show up at the input of the dual mode voltage sense amplifier 300. Since latch mode sensing is sensitive to input data at the instant of enabling transistor 324 turn-on, the linear mode of sensing is used for leakage testing. Linear mode sensing has the capability to read correct data even if the input voltage differential polarity (vinp–vinm) is incorrect at the time of enabling transistor 324 turn on as long as it gets the correct differential eventually.

The multiple configurations of the sense amplifier 300 are summarized below. The sense amplifier 300 operates as a read amplifier when sensing memory cell data to thereby generate a digital output. By virtue of a linear configuration, the sense amplifier 300 is capable to revert to the correct data output when the input differential signals do become correct, to thereby debug the sense amplifier 300 of leakage. In the linear mode, the sense amplifiers has the ability to read correctly eventually even if it is turned on with incorrect polarity at its inputs (but eventually recovering) as long as the sense differential is correct at the end of the sensing period. Thus, backup read is enabled.

In an embodiment, a sense amplifier circuit is disclosed, which comprises a differential latch amplifier comprising a cross coupled transmission gate circuit. An inverter is selectively coupled to the differential latch amplifier through the cross coupled transmission gate circuit. A differential signal generator comprising a reference signal source is coupled an input node of the differential latch amplifier. Both the differential latch amplifier and the cross coupled transmission gate circuit comprises a plurality of MOS transistors.

In particular the differential latch amplifier comprises a plurality of differential transistors. A first transmission gate is coupled at its control terminals to the inverter and is coupled between gate terminals of the plurality of differential transistors. A second transmission gate is coupled at its control terminals to the inverter and is coupled between a gate terminal and an output terminal of the plurality of differential transistors. A third transmission gate is coupled at its control terminals to a pair of voltage supplies and is coupled between a gate terminal and an input terminal of the plurality of differential transistors.

The differential signal generator comprises a current to voltage converter, which further comprises a plurality of input current terminals and a plurality of output voltage terminals.

Figure 4:
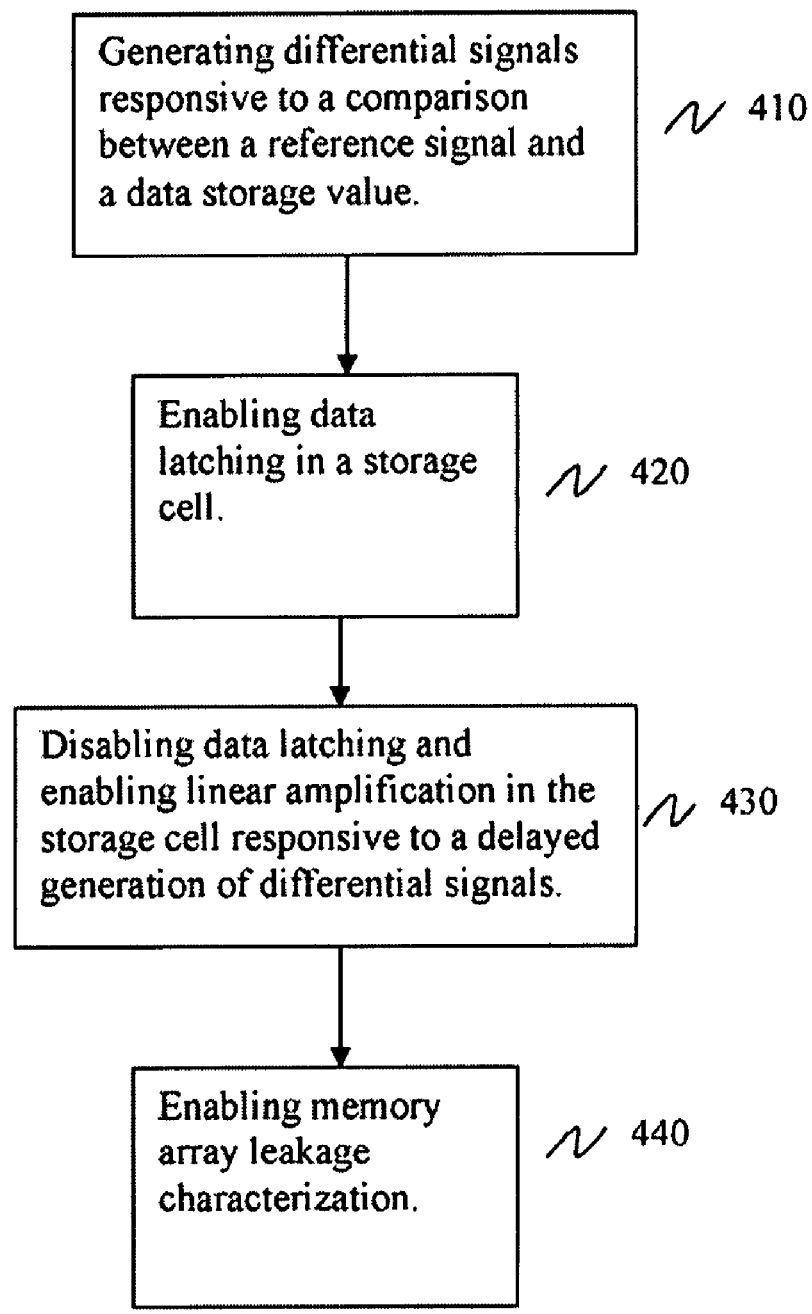
FIG. 4 illustrates a method for dual mode sensing in a memory circuit.

Referring to FIG. 4, a flow chart 400 illustrates a method for dual mode sensing in a memory circuit. A first step 410 comprises generating differential signals responsive to a comparison between a reference signal and a data storage value. The step of generating differential signals comprises a sub step of converting current to a differential voltage. The step of comparison between the reference signal and the data storage value comprises a sub step of comparing a reference current with a memory cell current. A second step 420 comprises enabling data latching in a storage cell responsive to the generation of the differential signals. The step of enabling data latching in a storage cell comprises a first sub step of developing a differential voltage corresponding to a digital logic value, a second sub step of latching the differential voltage corresponding to the digital value and a third sub step of amplifying the latched differential voltage to a digital output.

A third step 430 comprises disabling data latching and enabling linear amplification in the storage cell responsive to a delayed generation of differential signals. The step of disabling data latching and enabling linear amplification in the storage cell comprises a sub step of enabling linear sensing of differential voltage to thereby initiate debug. A fourth step 440 comprises enabling memory array leakage characterization, which further comprises a first sub step of establishing a leakage current reference, a second sub step of comparing a memory array leakage value with the established leakage current reference, a third sub step of regenerating differential signals and a fourth sub step of enabling linear differential sensing for characterizing memory array leakage currents. The steps 410 through 440 may be executed sequentially or randomly.

In an embodiment an output of the current to voltage converter 330 pertains to differential signals, which are applied to the sense amplifier circuit 300 to thereby generate an output corresponding to logic 0 value or logic 1 value.

Figure 5:
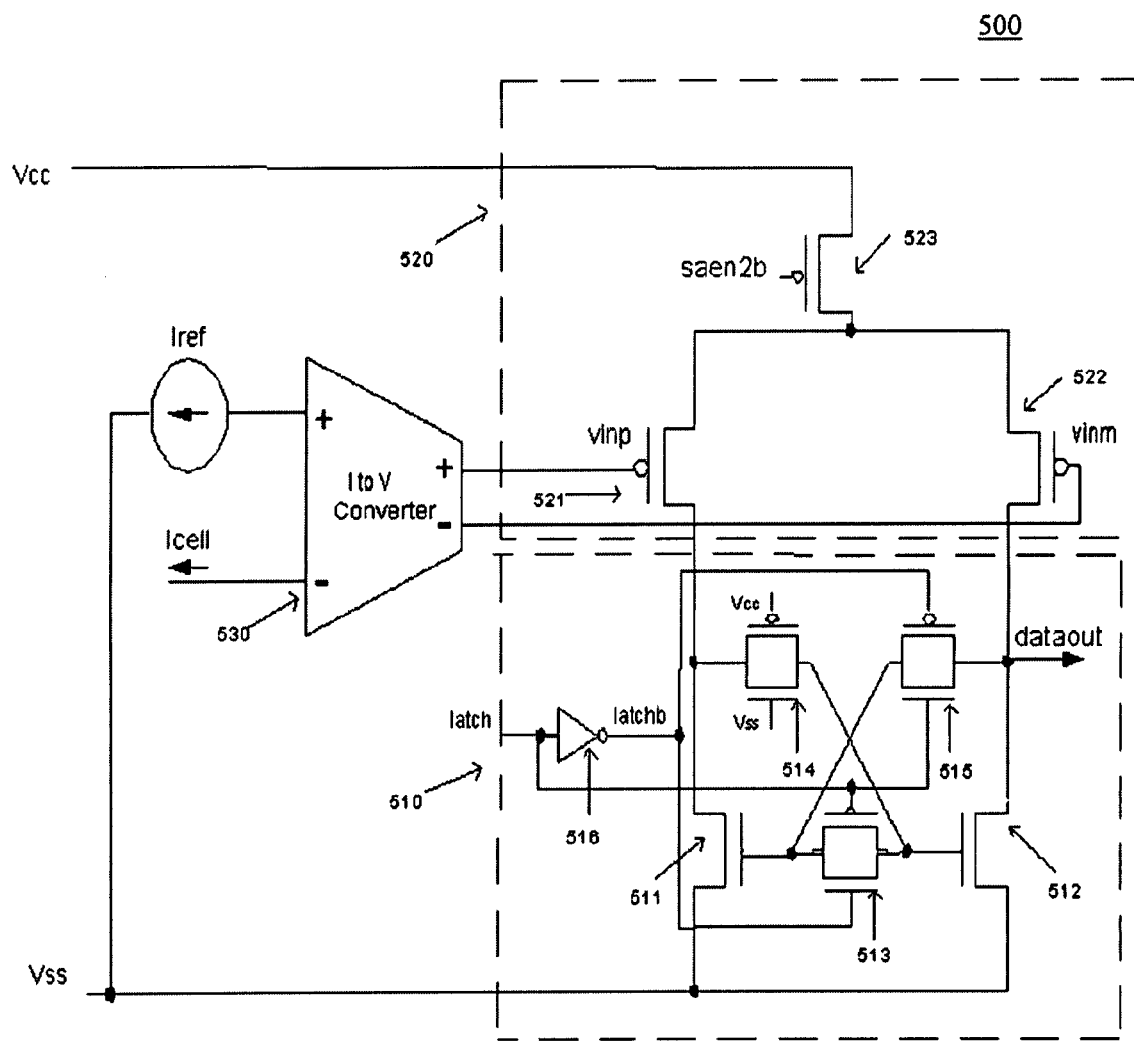
FIG. 5 illustrates an improved multiple mode sense amplifier circuit.

Referring to FIG. 5, an embodiment of a multiple mode sense amplifier circuit 500 is S shown, which comprises a configuration selector 510 further comprising a read amplifier, a debug circuit and a backup read circuit. A controllable input node 520 comprising an enabling circuit is coupled to the configuration selector 510. The sense amplifier circuit 500 also comprises a differential signal generator 530 further comprising a reference signal source, wherein the differential signal generator 530 coupled to the controllable input node 520. The multiple mode sense amplifier circuit 500 is powered by a higher voltage supply Vcc at a first terminal and is coupled to a lower voltage supply (grounded node) Vss at a second terminal. The lower voltage supply Vss is directly coupled to a terminal of the configuration selector 510 and the higher voltage supply Vcc is directly coupled to a terminal of the controllable input node 520.

The configuration selector 510 comprises a plurality of transistors 511 and 512. A plurality of cross coupled transmission gates 513, 514 and 515 is coupled to the plurality of transistors 511 and 512 and is also coupled to an inverter 516. An external signal (latch) is applied to the inverter 516, which is inverted (latchb) and is applied to the plurality of cross coupled transmission gates 513, 514 and 515. The plurality of cross coupled transmission gates comprises a first transmission gate 513, a second transmission gate 514 and a third transmission gate 515. The plurality of transistors 511 and 512 comprises a plurality of NMOS transistors. Both the first transmission gate 513 and the third transmission gate 515 are coupled at their control terminals to an output terminal and an input terminal of the inverter 516. The second transmission gate 514 is coupled to the higher voltage supply Vcc and the lower voltage supply Vss at its control terminals. Thus, it can be seen that the plurality of cross coupled transmission gates is selectively coupled to the inverter 516. Signals (Vcc, Vss and output of the inverter 516) applied to the plurality of cross coupled transmission gates cause data read, data debug and data back up read functions to be effectuated.

The controllable input node 520 comprises a plurality of input transistors 521 and 522 and an enabling transistor 523, which is coupled to an enable signal (saen2b) at its control terminal, wherein vinp and vinm are two differential input signals applied at input terminals of the plurality of input transistors 521 and 522. The plurality of input transistors comprises a plurality of PMOS (P-channel Metal Oxide Semiconductor) transistors. The enabling transistor 523 comprises a PMOS transistor. The differential signal generator 530 comprises a current to voltage converter 530 (I to V converter), which further comprises a differential amplifier. The differential amplifier comprises a plurality of input terminals (a current reference Iref and a memory cell current (Icell) and a plurality of output voltage terminals. The differential amplifier is a dual input dual output differential amplifier. A current reference Iref is coupled to a positive input terminal (+) of the differential amplifier and a current signal Icell is coupled to a negative input terminal (−) of the differential amplifier. Thus, having NMOS transistors in the configuration selector 510 and PMOS transistors in the controllable input node 520 is converse to a configuration of the sense amplifier 300. Operation of the sense amplifier 500 is similar to operation of the sense amplifier 300.

Thus, a circuit with dual mode sensing configuration is provided in the embodiments of the invention, which allows for high speed with low power consumption using the sense amplifier in a half latch mode. In a linear mode, the sense amplifier is configured as a differential amplifier for memory column leakage measurements. In the linear mode the sense amplifiers has the ability to read correctly eventually even if it is turned on with incorrect polarity at its inputs (but eventually recovering) as long as the sense differential is correct at the end of the sensing period. Thus, the linear mode is also used as a backup and debug tool for the latch based mode in case the sense timing came out incorrect on silicon. The dual mode sense amplifier has the advantage of having the ability to combine both linear and latch sense amplifier without much area overhead by the use of analog switches to reconfigure the amplifier. The same concept of the dual mode amplifier can be applied to a PMOS transistor input pair and NMOS transistor cross couple stage with full transmission gates working as analog switches.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved sense amplifier circuit and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit, comprising:
    a configuration selector comprising a read amplifier, a debug circuit and a backup read circuit;
    a controllable input node comprising an enabling circuit, the controllable input node coupled to the configuration selector; and
    a differential signal generator comprising a reference signal source, the differential signal generator is coupled to the controllable input node,
    wherein said configuration selector is operable to selectively couple a signal to disable data latching and further operable to enable linear amplification in a storage cell responsive to a delayed generation of different signals generated by said differential signal generator.

2. The circuit of claim 1, wherein the configuration selector comprises:
    a plurality of transistors further comprising a plurality of Metal Oxide Semiconductor (MOS) transistors;
    a plurality of cross coupled transmission gates coupled to the plurality of transistors in a positive feedback configuration; and
    an inverter selectively coupled to the plurality of cross coupled transmission gates, in a latch enable configuration and in a linear enable configuration.

3. The circuit of claim 2, wherein the plurality of cross coupled transmission gates is coupled to:
    a control node comprising a gate terminal of a MOS transistor;
    an input node; and
    an output node of the plurality of transistors.

4. The circuit of claim 1, wherein the controllable input node comprises:
    a plurality of input transistors coupled to a plurality of differential input signals from the differential signal generator; and
    an enabling transistor coupled to a common input node of the plurality of input transistors.

5. The circuit of claim 4, wherein the enabling transistor is coupled to a latch sense enable signal at a gate terminal.

6. The circuit of claim 1, wherein the differential signal generator comprises a current to voltage converter.

7. The circuit of claim 6, wherein the current to voltage converter comprises a differential amplifier further comprising a plurality of input current terminals and a plurality of output voltage terminals.

8. The circuit of claim 1, further comprising a multiple mode differential amplifier unit.

9. A method, comprising:
    generating differential signals responsive to a comparison between a reference signal and a data storage value;
    enabling data latching in a storage cell;
    disabling data latching and enabling linear amplification in the storage cell responsive to a delayed generation of differential signals; and
    enabling memory array leakage characterization.

10. The method of claim 9, wherein the step of generating differential signals responsive to the comparison between the reference signal and the data storage value comprises generating a differential voltage.

11. The method of claim 9, wherein the step of comparison between the reference signal and the data storage value comprises comparing a reference current with a memory cell current.

12. The method of claim 9, wherein the step of enabling data latching in the storage cell comprises:
- developing a differential voltage corresponding to a digital logic value;
- latching the differential voltage corresponding to the digital value; and
- amplifying the latched differential voltage to a digital output.

13. The method of claim 9, wherein the step of disabling data latching in the storage cell responsive to the delayed generation of differential signals comprises enabling linear sensing of differential voltage to thereby initiate debug.

14. The method of claim 9, wherein the step of enabling memory array leakage characterization comprises:
- establishing a leakage current reference;
- comparing a memory array leakage value with the established leakage current reference;
- regenerating differential signals; and
- enabling linear differential sensing for characterizing a memory array leakage current.

* * * * *